United States Patent
Gomm et al.

(10) Patent No.: US 8,237,474 B2
(45) Date of Patent: Aug. 7, 2012

(54) DELAY LINE OFF-STATE CONTROL WITH POWER REDUCTION

(75) Inventors: Tyler J. Gomm, Meridian, ID (US); Debra Bell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 190 days.

(21) Appl. No.: 12/506,000

(22) Filed: Jul. 20, 2009

(65) Prior Publication Data

US 2009/0309637 A1    Dec. 17, 2009

Related U.S. Application Data

(63) Continuation of application No. 10/927,248, filed on Aug. 26, 2004, now Pat. No. 7,583,115.

(51) Int. Cl.
*H03L 7/06*       (2006.01)

(52) U.S. Cl. .................. 327/149; 327/158; 327/153

(58) Field of Classification Search ............... 327/149, 327/158, 153
See application file for complete search history.

(56) References Cited

U.S. PATENT DOCUMENTS

| | | | |
|---|---|---|---|
| 5,909,133 A * | 6/1999 | Park ................................ | 327/277 |
| 5,963,069 A | 10/1999 | Jefferson et al. ............... | 327/158 |
| 6,137,334 A | 10/2000 | Miller, Jr. et al. .............. | 327/271 |
| 6,346,837 B1 | 2/2002 | Shibayama ..................... | 327/156 |
| 6,445,231 B1 | 9/2002 | Baker et al. ..................... | 327/158 |
| 6,483,359 B2 | 11/2002 | Lee ................................. | 327/158 |
| 6,489,823 B2 | 12/2002 | Iwamoto ......................... | 327/158 |
| 6,549,041 B2 | 4/2003 | Waldrop ............................. | 327/5 |
| 6,586,979 B2 | 7/2003 | Gomm et al. .................. | 327/161 |
| 6,728,163 B2 | 4/2004 | Gomm et al. .................. | 365/233 |
| 6,759,883 B2 * | 7/2004 | Gomm ............................ | 327/276 |
| 6,930,525 B2 | 8/2005 | Lin et al. ........................ | 327/161 |
| 7,583,115 B2 * | 9/2009 | Gomm et al. .................. | 327/149 |
| 2002/0135409 A1 * | 9/2002 | Gomm et al. .................. | 327/161 |
| 2002/0190767 A1 | 12/2002 | Gomm et al. .................. | 327/161 |
| 2006/0044029 A1 | 3/2006 | Gomm et al. .................. | 327/153 |

* cited by examiner

*Primary Examiner* — Hai L Nguyen
(74) *Attorney, Agent, or Firm* — Dorsey & Whitney LLP

(57) ABSTRACT

A method and apparatus is provided for controlling a delay line for achieving power reduction. The device comprises a delay lock loop to provide an output signal based upon a phase difference between a reference signal and a feedback signal, said delay lock loop comprising at least one delay circuit comprising a plurality of logic gates configured to provide for substantially uniform degradation of a plurality of NAND gates in a static state.

23 Claims, 8 Drawing Sheets

DELAY LINE OFF-STATE CONTROL WITH POWER REDUCTION

CROSS-REFERENCE TO RELATED APPLICATION

This application is a continuation of U.S. patent application Ser. No. 10/927,248 filed Aug. 26, 2004 now U.S. Pat. No. 7,583,115. This application is incorporated by reference herein.

BACKGROUND OF THE INVENTION

1. Field of the Invention

This invention relates generally to a semiconductor memory device, and, more specifically, to controlling a delay line for achieving power reduction.

2. Description of the Related Art

Modern integrated circuit devices are comprised of millions of semiconductor devices, e.g., transistors, formed above a semiconductor substrate, such as silicon. These devices are very densely packed, i.e., there is little space between them. Similarly densely packed electrically conducting lines may also be formed in the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of word lines that may be electrically coupled to one or more capacitors in a semiconductor memory.

The semiconductor memory may be a dynamic random access memory, a flash memory, and the like. The semiconductor memory typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets, of the complete collection of memory cells. For example, a semiconductor memory having 16 megabits ($2^{24}$ bits) of storage capacity may be divided into 64 sub-arrays, each having 256K ($2^{18}$) memory cells.

Flash memory (sometimes called "flash RAM") is a type of non-volatile memory that can be erased and reprogrammed in units of memory called blocks. Other types of memory may be erased and rewritten in smaller units, such as units at the byte level, which is more flexible, but slower than the block operations of flash memory. Flash memory is commonly used to hold control code such as the basic input/output system (BIOS) in a personal computer. When BIOS needs to be changed (rewritten), the flash memory can be written in block (rather than byte) sizes, making it faster to update. Applications employing flash memory include digital cellular phones, digital cameras, LAN switches, computers, digital set-up boxes, embedded controllers, and other devices.

Typically, digital systems, such as memory systems, may comprise a delay lock loop that may be used to align the edges of a plurality of digital signals. For example, a delay lock loop circuit may be used to align the rising edge and/or the falling edge of a clock signal based upon a reference clock signal, to produce a synchronized clock signal. Many times, digital signals from multiple sources access one or more memory spaces in a memory unit. It is desirable that these digital signals be synchronized for proper access of memory. Typical delay lock loops comprise a phase detect unit that detects the phase differences between a plurality of signals. The output of the phase detect unit is then used to affect the operation of a filter that adjusts the delay of an output of the delay lock loop. Typical delay lock loop circuits provide a delay block and a delay line (DLL delay line) that implement a delay upon an input clock signal to produce a delayed, output clock signal.

Generally, in the DLL delay line, there is a circuit that includes NAND-gate pairs that provide a fundamental coarse delay element. There may be a plurality of DLL delay lines in a device. Generally, DLL delay lines are designed to toggle only the stages that need to toggle to implement desired delay and synchronization. Therefore, other upstream DLL delay lines do not toggle unnecessarily. This feature is designed into DLL delay circuits for power reduction purposes. Often, there may be 90 or more delay elements in a particular device, wherein only 10 to 20 would toggle at any given time.

In order to achieve equality in propagation times and power savings, "NAND-to-NAND" delay elements are used in DLL circuitry. However, when applying these types of delay elements, device degradation may occur. For example, P-channel elements in various NAND gates that are used in the DLL delay lines may degrade differently from N-channel elements within the NAND gates. The NAND-to-NAND topology is generally used to effectuate an equality in propagation delay that occurs because of the transition from high to low in the first NAND, plus the propagation delay due to the transition from high to low in the second NAND, is assumed to be the same as the low to high propagation in the first NAND plus the high to low propagation. Therefore, the duty cycles, in theory, are designed to be consistent, such that no additive duty cycle error occurs in the clock signal.

However, due to the variations in degradation, one NAND gate may degrade differently from another NAND gate, and therefore, duty cycle errors may occur. If there were a slight duty cycle problem, for example, a pair of NAND gate fundamentally propagating the rising edges faster than the low-going edges, a cumulative effect due to the slight duty cycle error may occur. If this duty cycle problem were to occur in multiple NAND gates, a large duty cycle error may occur. Therefore, one problem associated with using the NAND-to-NAND topology may be that different propagation delays resulting from a signal transition from high to low time in the NAND versus an inverter may occur. This would negate the various assumptions relating to utilizing NAND-NAND topologies.

Turning now to FIG. 1, a NAND-to-NAND topology is illustrated. FIG. 1 illustrates a first NAND gate 110 and a second NAND gate 120. The proper operation of a delay line represented by the circuit in FIG. 1 depends on the assumptions illustrated by equations 1, 2, and 3. Equation 1 shows an assumption that the high to low transition time for the first and the second NAND gates are equal.

$$t_{PHL1} = t_{PHL2} \qquad \text{EQUATION 1}$$

Equation 2 relates that the low to high transitions for the first NAND gate 110 and the second NAND 120, are equal.

$$t_{PLH1} = t_{PLH2} \qquad \text{EQUATION 2}$$

$$t_{PHL1} + t_{PLH2} = t_{PLH1} + t_{PHL2} \qquad \text{EQUATION 3}$$

Therefore, as illustrated in Equation 3, the addition of the time period for a signal transition from high to low, plus the time period for a signal transition from low to high equals to the time period for a signal transition from low to high for the first NAND gate (110), plus the time period for a signal transition from high to low for the second NAND gate (120). If these were indeed true, the duty cycle of an original clock on a line 105 may be reproduced by the delay line circuit of FIG. 1 on the clock OUT signal on a line 135. However, due to the degradation of various NAND gates, the assumptions provided in Equations 1, 2, and 3, may not hold true. Therefore, this phenomenon may cause a duty cycle error between the difference in the clock IN on the line 105 and the clock OUT on the line 135.

One possible solution to such an additional delay may be that if a duty cycle error is known, for example a duty cycle error of 300 picoseconds is expected, possible corrections could include adding an additional 300 picoseconds delay to the delay line circuit of FIG. 1. However, this creates a problem with dynamic clock applications. The 300 picoseconds delay may depend on the actual frequency of the clock IN on the line 105. If the clock frequency is changed, the additional delay error may change also, leaving the possibility of continued duty cycle errors.

The present invention is directed to overcoming, or at least reducing, the effects of, one or more of the problems set forth above.

SUMMARY OF THE INVENTION

In one aspect of the instant invention, a device is provided for controlling a delay line for achieving power reduction. The device comprises a delay lock loop to provide an output signal based upon a phase difference between a reference signal and a feedback signal, said delay lock loop comprising at least one delay circuit comprising a plurality of logic gates configured to provide for substantially uniform degradation of a plurality of NAND gates in a static state.

In another aspect of the instant invention, a delay lock loop is provided for controlling a delay line for achieving power reduction. The delay lock loop provides an output signal, a feedback delay unit and a phase detector. The output signal is based upon a phase difference between a reference signal and a feedback signal. The delay lock loop comprises a delay unit. The delay unit comprises at least one delay element that is adapted to provide a delay upon at least one of a reference signal and the output signal. The delay unit comprises a plurality of logic gates configured to provide for substantially uniform degradation of a plurality of NAND gates in a static state. The feedback delay unit provides a delay upon the output signal to generate the feedback signal. The phase detector recognizes a phase difference between the reference signal and the feedback signal.

In another aspect of the instant invention, a memory device is provided which controls a delay line for achieving power reduction. The memory device comprises a delay lock loop to provide an output signal based upon a phase difference between a reference signal and a feedback signal. The delay lock loop comprises at least one delay circuit comprising a plurality of logic gates configured to provide for substantially uniform degradation of a plurality of NAND gates in a static state.

In yet another aspect of the instant invention, a system board is provided which controls a delay line for achieving power reduction. The system board comprises a first device operatively coupled to a second device. The first device comprises a memory location for storing data and a delay lock loop to provide an output signal based upon a phase difference between a reference signal and a feedback signal. The delay lock loop comprises at least one delay circuit comprising a plurality of logic gates configured to provide for substantially uniform degradation each NAND in a NAND-NAND pair. The second device is operatively coupled to the first device. The second device accesses data from the first device based upon an operation performed by the delay lock loop.

BRIEF DESCRIPTION OF THE DRAWINGS

The invention may be understood by reference to the following description taken in conjunction with the accompanying drawings, in which like reference numerals identify like elements, and in which.

Figure 1:
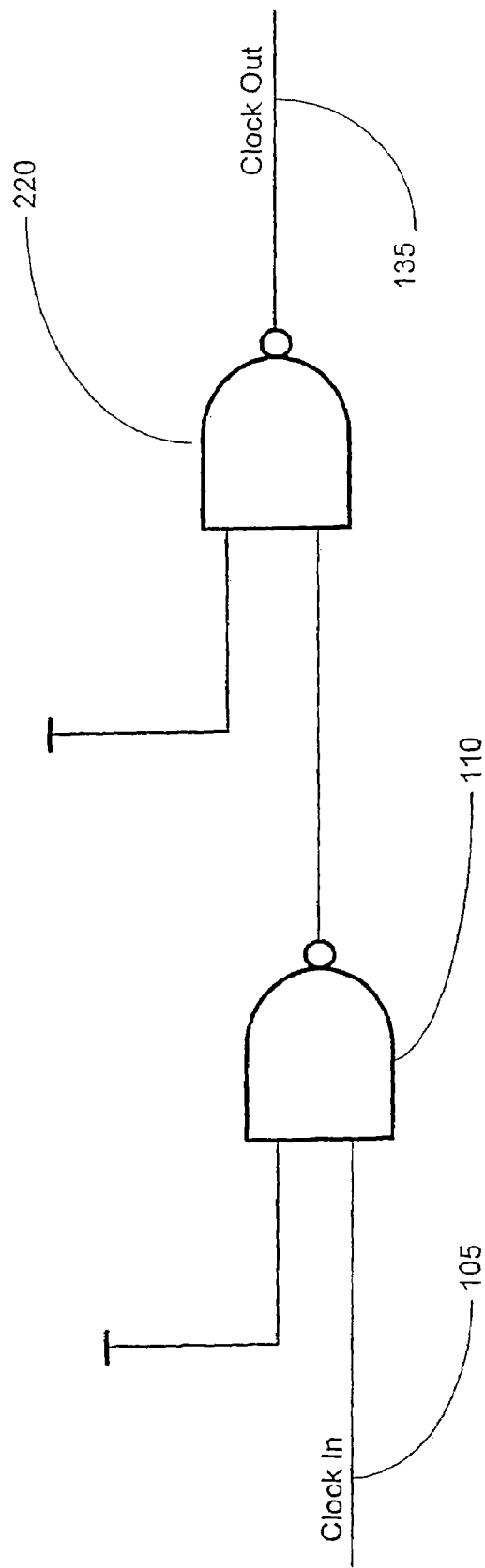
FIG. 1 is a simplified circuit diagram of a prior art delay line unit cell utilized in a prior art delay lock loop system.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Synchronization between multiple digital signals in a digital system is important for accurate exchange of digital data. Often, delay lock loops are employed to synchronize digital signals. For example, a NAND gate that has a static high state applied to one input may degrade differently than a NAND gate with a static low applied to the same corresponding input, causing the high-to-low or low-to-high times to be unequal in relation to the corresponding propagation time periods of other NAND gates in the delay element 520. This may cause duty cycle distortion through the delay element, i.e., pair of NANDs. For example, the duty cycle may be calculated as a ratio of the time period where a signal is high, versus the clock period. For example, for memory devices such as double data rate DRAM (DDR-DRAM, DDR I device, DDR II device), if there is a two nanosecond cycle time, the "high" time period should be substantially equal to one nanosecond. Similarly, the "low" time period should be substantially equal to one nanosecond. For DDR-DRAM, these "low" and "high" time periods generally directly translate to input and/or output data windows since data transitions may be made on the high edge and the falling edge of a clock signal. Duty cycle distortion may occur when some time period is taken away from either the high time period or from the low time period. For example, for the two nanosecond cycle time described above, if the high time period is less than one nanosecond, or if the low time period is less than one nanosecond, a duty cycle distortion problem may occur. In other words, the window for proper data transitions may become smaller and data errors may occur.

Embodiments of the present invention call for reducing the effects of possible gate degradation that may occur unevenly in a circuit, such as a delay line circuit associated with a delay lock loop. For example, embodiments of the present invention allow for various inputs of NAND gates that are used in a delay lock loop to be substantially identical so that the NAND gates degrade very similarly. Even though this uniform degradation may cause some propagation delays; it may reduce duty cycle distortion problems. Embodiments of the present invention provide for implementing a balancing scheme to balance the input logic states to each of the two NANDs in a NAND-NAND pair, such that the input of each NAND in a unit delay element experiences the same logic state, providing for uniform degradation. This may reduce the possibility of duty cycle distortion.

Figure 2:
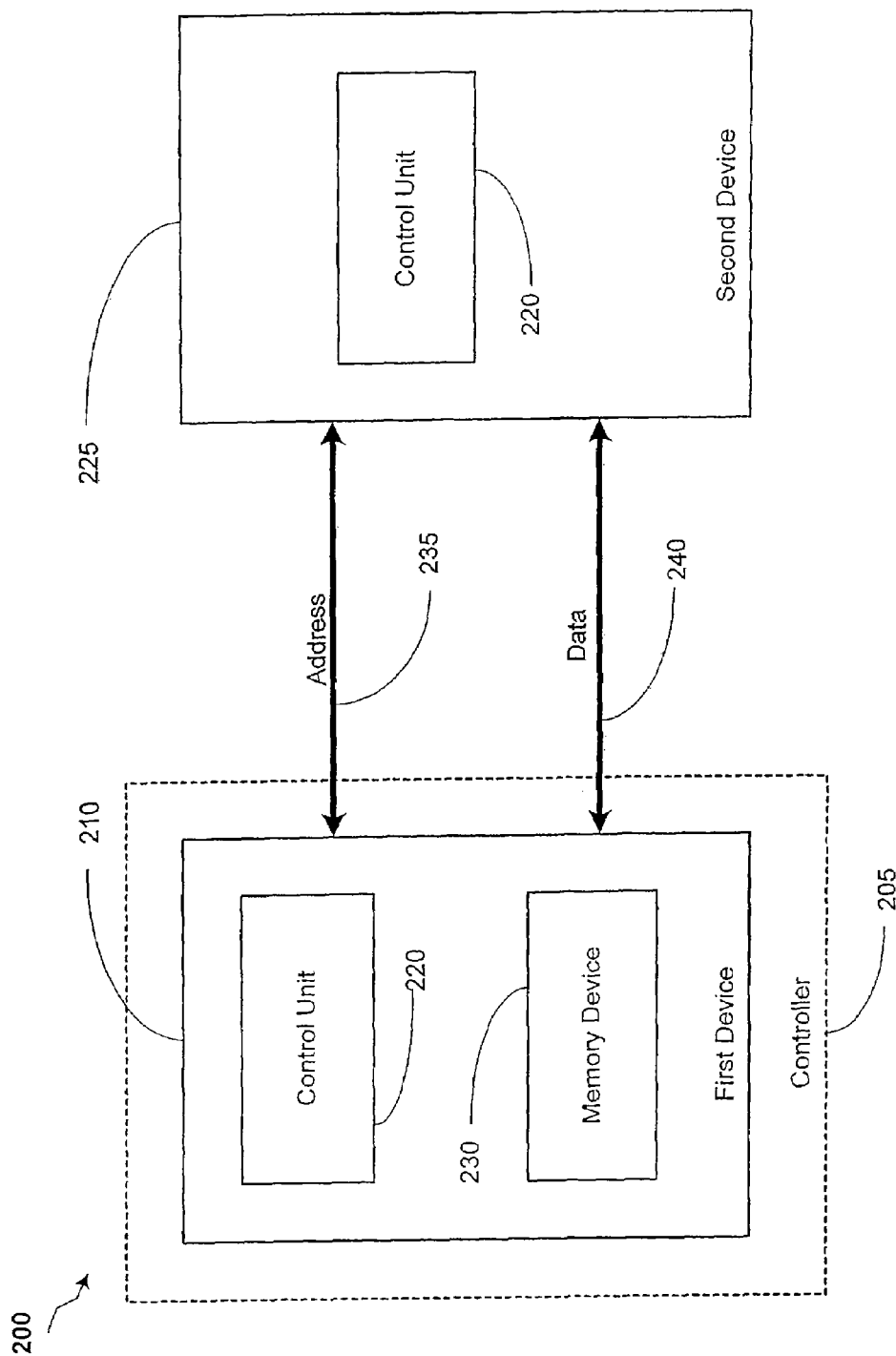
FIG. 2 is a block diagram of a system including a device that is capable of accessing digital data, in accordance with one embodiment of the present invention.

Referring to FIG. 2, a block diagram of a system 200 is illustrated, in accordance with one embodiment of the present invention. The system 200 comprises a first device 210, which, in one embodiment, may comprise a memory device 230 capable of storing data. In one embodiment, the memory device 230 may be a dynamic random access memory (DRAM), a static random access memory (SRAM), a double-data rate synchronous DRAM (DDR SDRAM), a Rambus™ DRAM (RDRAM), a FLASH memory device, or the like. The first device 210 may be encompassed by a controller 205. In one embodiment, the controller 205 may be a memory controller, a computer system, such as a PC-computer, and the like. The first device 210 may be accessed by a second device 225, which, in one embodiment, may be an accessing/access device. The second device 225 may send addresses on a line 235 to the first device 210. The first device 210 may then provide data to the second device 225 on a line 240. The first and second devices 210, 225 may comprise a control unit 220 capable of accessing data (including code) stored in the memory device 230 of the first device 210. The second device 225 may be any device that uses the first device 210 to store data, read data, or both. Examples of the second device 225 may include, but are not limited to, a computer, a camera, a telephone, a television, a radio, a calculator, a personal digital assistant, a network switch, and the like.

The control unit 220, in one embodiment, may manage the overall operations of the second device 225, including writing and reading data to and from the first device 210. The control unit 220 may comprise a microprocessor, a microcontroller, a digital signal processor, a processor card (including one or more microprocessors or controllers), a memory controller, or other control or computing devices.

In one embodiment, the first device 210 may be a memory device, such as a DRAM device, an SRAM device, a FLASH memory device, and the like. In one embodiment, the first device 210 may be a memory chip device that may be implemented into a digital system, such as a computer system. In an alternative embodiment, the first device 210 may be an external memory, such as a memory stick, and may be accessed when inserted into a slot (not shown) of the second device 225. When inserted into the slot, the second device 225 may provide the appropriate power and control signals to access memory locations in the first device 210. The first device 210 may be external to, or internal (e.g., integrated) to, the second device 225. The second device 225, which may be a computer system, may employ a first device 210 (in the form of a memory device) that is integrated within the computer system to store data (e.g., BIOS [basic input/output system]) related to the computer system.

Figure 3:
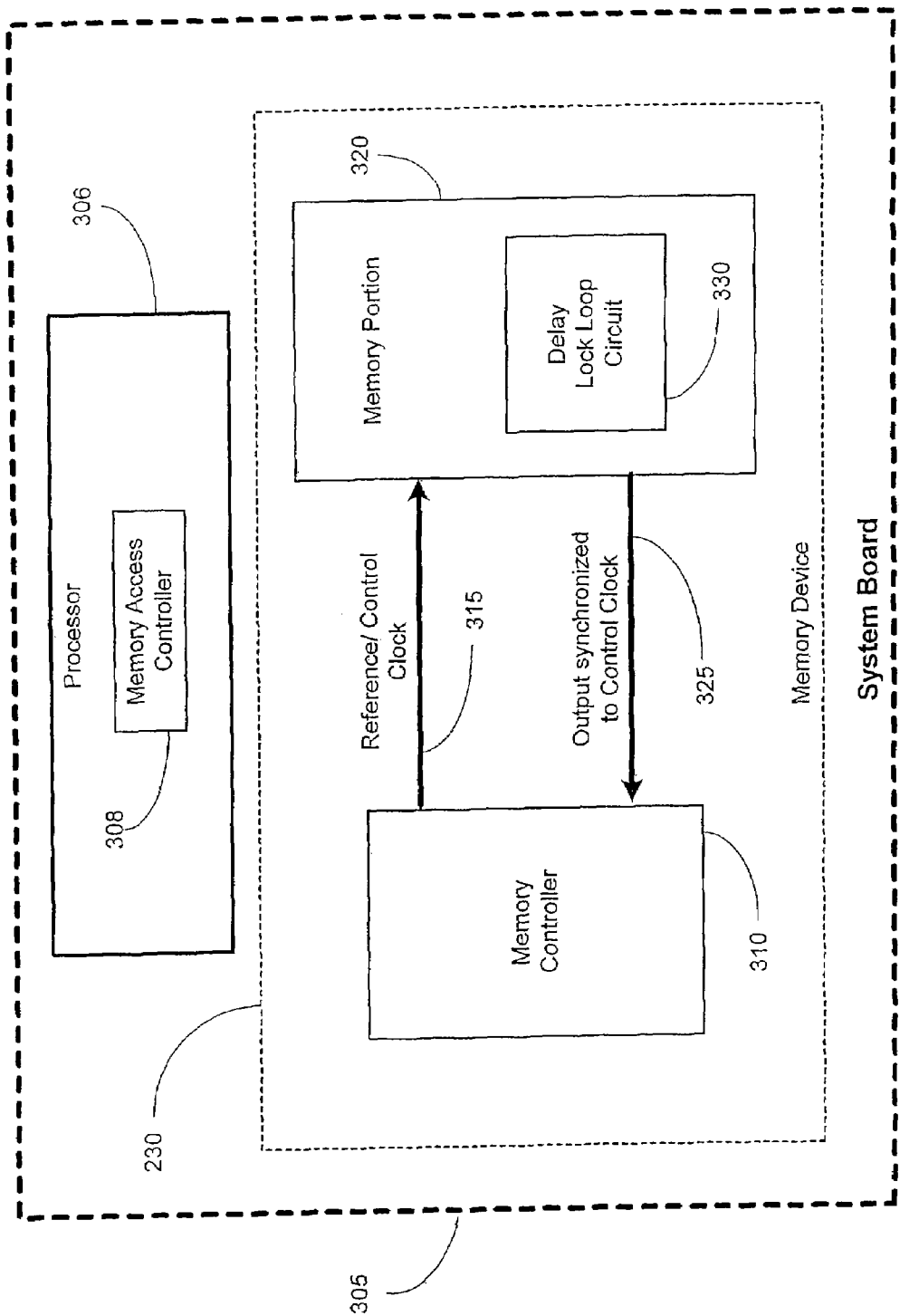
FIG. 3 is a more detailed block diagram representation of the a system board including a memory device of FIG. 2, in accordance with one illustrative embodiment of the present invention.

Turning now to FIG. 3, a more detailed block diagram depiction of the memory device 230 in accordance with one illustrative embodiment of the present invention is provided. In one embodiment, the memory device 230 comprises a memory controller 310, which is operatively coupled to one or more memory portions 320. The memory controller 310 may comprise circuitry that provides access (e.g., such as storing and extracting data to and from the memory portions 320) to control operations of the memory device 230. The memory portion 320 may be an array of memory storing modules that are capable of storing data.

Proper timing of the data signals carrying data from the memory portion 320 is useful in extracting data accurately. For example, if the period of the control clock is 5 nanoseconds, and the data is to be sent or received on every clock edge of the control clock on a line 315 (e.g., as in the case of a double data rate [DDR SDRAM]) then there is a 3.5 nanosecond maximum timing window available to send or receive the data. Therefore, a delay lock loop may be employed to synchronize various digital signals (e.g., operation clocks, data signals, etc.) to ensure that data access is performed within acceptable timing windows.

In one embodiment, the memory portion 320 may comprise a delay lock loop circuit 330. In alternative embodiments, the delay lock loop circuit 330 may reside in other portions of the memory device 230, such as in the memory controller 310. The delay lock loop circuit 330 is capable of locking a plurality of digital signals based upon a reference or a control clock on a line 315. A delay generated by the delay lock loop circuit 330 may be used to synchronize the output signal carrying data from the memory portion 320 to an external clock, such as a control clock derived from a system clock. The memory portion 320 is capable of providing one or more output signals to the memory controller 310 based upon a reference or control clock received by the memory portion 320. The reference/control clock on a line 315 may be generated by the memory controller 310 and/or from a component external to the memory device 230, such as the control unit 220.

In one embodiment, the memory portion 320 receives a control clock on the line 315 from the memory controller 310. The delay lock loop circuit 330 is capable of utilizing the control clock on the line 315 and providing an output synchronized to the control clock on a line 325. The memory controller 310 may use the output that is synchronized to the control clock on the line 315 to supply data to outside sources, such as the second device 225 and/or various components associated with the first device 210 (see FIG. 2).

Continuing to refer to FIG. 3, improvements in delay lock loop synchronization of digital signals may result in more accurate and efficient storing and/or extraction of data to and from the memory portion 320. The delay lock loop circuit 330 is capable of aligning the input edges and/or the output edges of various digital signals based upon the control clock on the line 315. The delay lock loop circuit 330 is capable of performing a phase detect function based upon the control clock on the line 315, and creating a feedback loop to lock the edges of a plurality of digital signals. Using the delay lock loop circuit 330, multiple signals may be synchronized for effective and accurate transmission of data.

As shown in FIG. 3, the memory device 230 may be part of a system board 305 (e.g., a printed circuit board) that includes a processor 306. The system board 305 may be a motherboard that is utilized in a variety of types of computer systems, such as an IBM compatible computer system, a workstation computer system, a mainframe computer system, an Apple computer system, a portable computer, a PDA, and the like. The memory controller 310 is capable of receiving and executing memory access functions in response to instructions from the processor 306. The processor 306 may comprise a memory access controller 308 that is used by the processor 306 to access data in the memory device 230.

Figure 4:
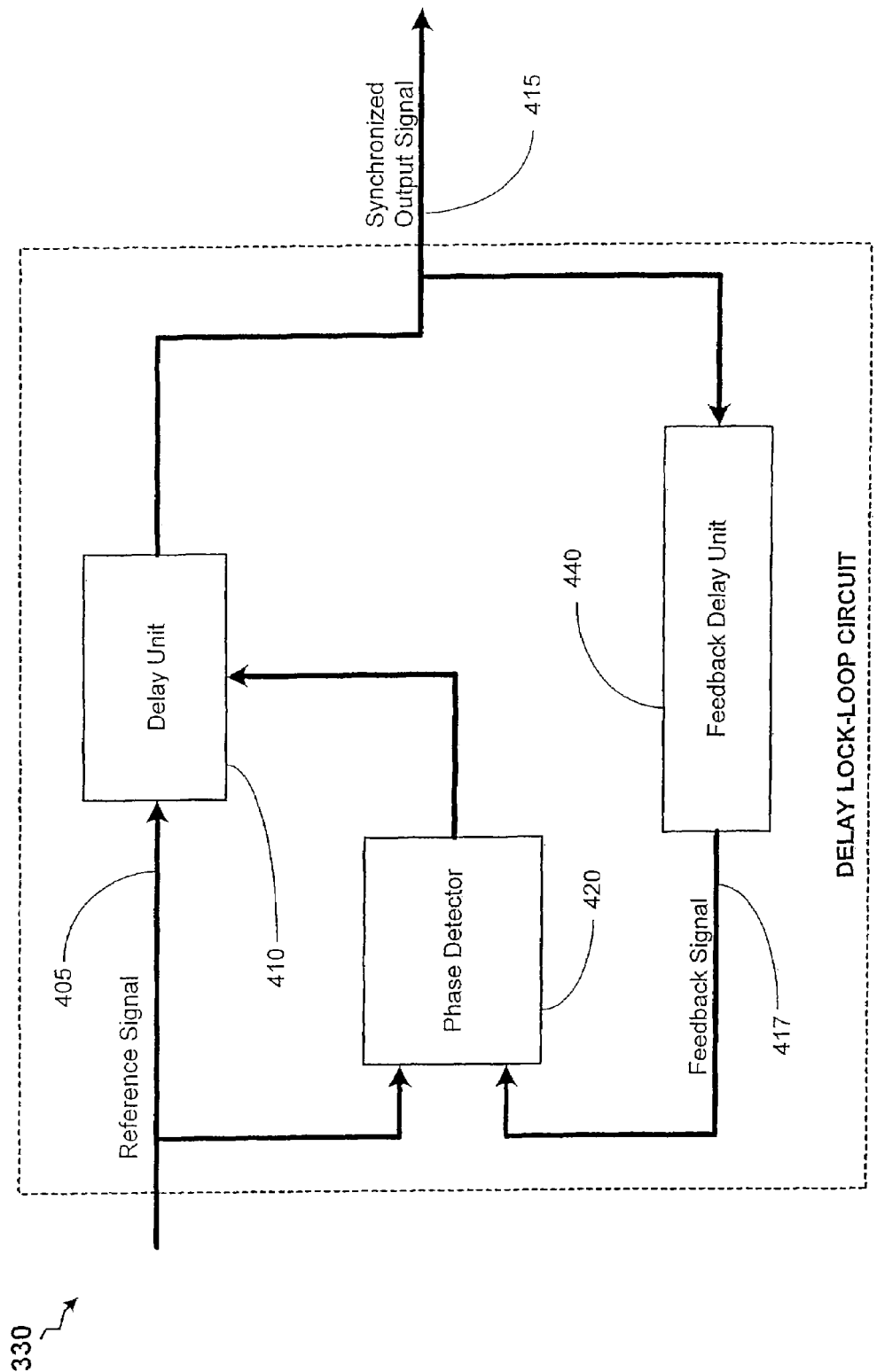
FIG. 4 illustrates a block diagram representation of a delay lock loop circuit of FIG. 3, in accordance with one illustrative embodiment of the present invention.

Turning now to FIG. 4, a more detailed description of the delay lock loop circuit 330 is illustrated. In one embodiment, the delay lock loop circuit 330 comprises a delay unit 410, a feedback delay unit 440, and a phase detector 420. Some portions of the delay lock loop circuit 330 are not shown as to not obscure the present invention, however, those skilled in the art having benefit of the present disclosure would be able to implement all portions of the delay lock loop circuit 330 and remain with the scope and spirit of the present invention.

The delay unit 410 provides a delay based upon a reference clock, which may be the control clock on the line 315. In one embodiment, the delay unit 410 implements a delay adjustment onto the reference signal (e.g., a reference clock signal) on a line 405. Although a single block (block 410) is shown to represent a delay to be imposed onto the reference signal on the line 305, it would be appreciated by those skilled in the art having benefit of the present disclosure that there may be a plurality of delay stages with the delay unit 410. For example the delay unit 410 may include a coarse delay and a fine delay that may be separately controlled by the delay lock loop circuit 330. The signal delayed by the delay unit 410 is provided as a synchronized output signal on a line 415. The synchronized output signal on the line 415 may be used to clock in and out various data lines to and from the memory device 230.

The feedback delay unit 440 provides a feedback delay for the phase detector 420 on a line 417. In one embodiment, the synchronized output signal on the line 415 is delayed by the feedback delay unit 440. The phase detector 420 detects a phase difference between the reference signal on the line 405 and the signal from the feedback delay unit 440 on the line 417. The phase detector 420 provides a signal that indicates the phase difference between the reference lock and the feedback clock on the line 417. The phase detector 420 provides a delay signal to the delay unit 410, which may be based a control signal sent to the delay lock loop circuit 330.

The output of the delay lock loop circuit 330 provides a synchronized output signal on the line 415 for providing synchronized extraction of data to and from the memory device 230. Generally, the delay lock loop circuit 330 provides a first order control system that is generally stable and does not generally accumulate substantial phase error. In one embodiment, the absence of significant phase error may be due to the elimination of a voltage control oscillator, which may cause jitter(s) in the resulting transfer function. In one embodiment, as compared to a voltage-controlled oscillator (used in a phase lock loop), the delay lock loop is generally not a frequency synthesizer and is typically more immune to noise. A more detailed illustration and description of the delay unit 410 in accordance with one embodiment of the present invention is provided in FIG. 5 and accompanying description below.

Figure 5:
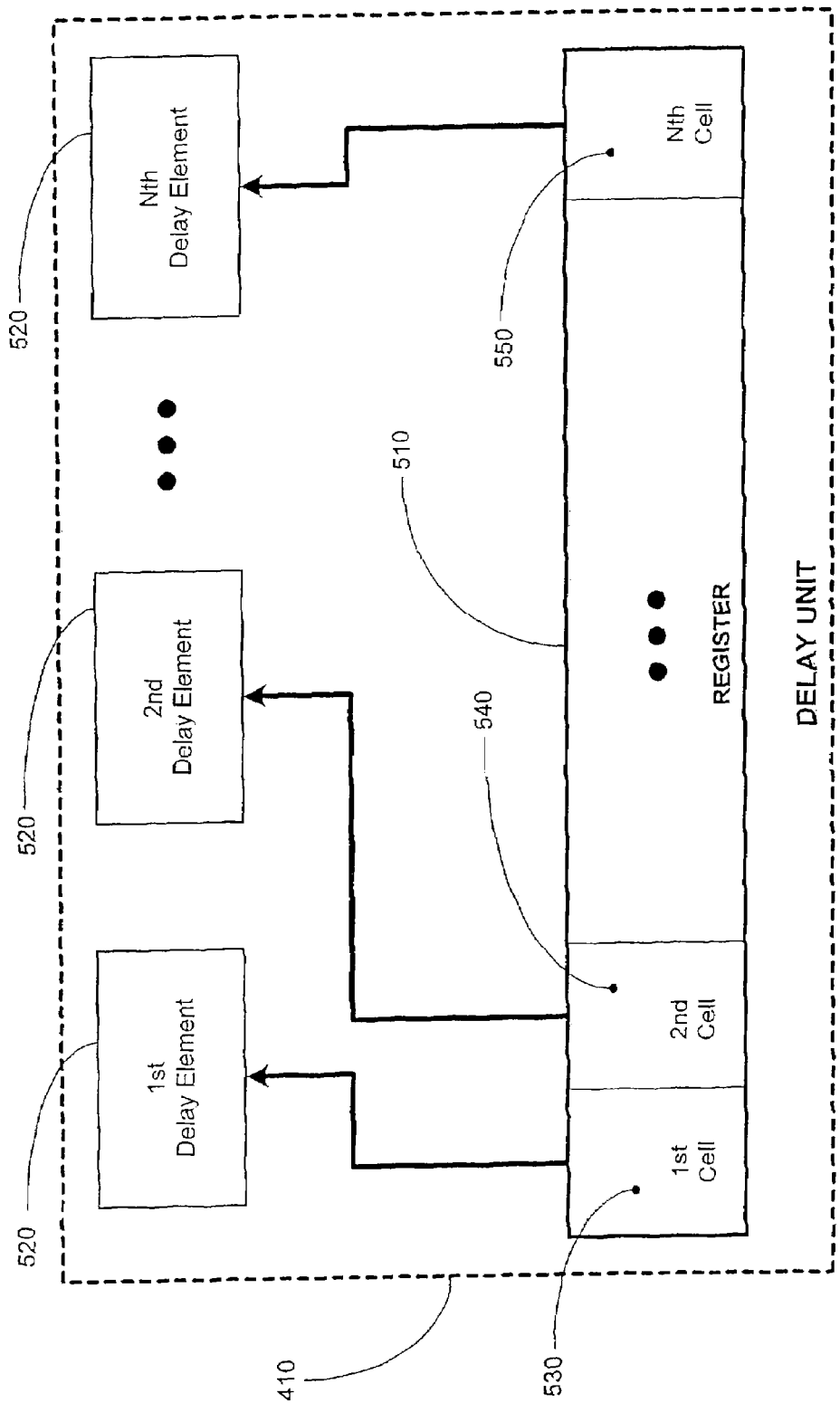
FIG. 5 is a more detailed block diagram representation of a delay unit of FIG. 4, in accordance with one illustrative embodiment of the present invention.

Turning now to FIG. 5, a block diagram representation of the delay unit 410 in accordance with one embodiment of the present invention is illustrated. In one embodiment, the delay unit 410 comprises a $1^{st}$, $2^{nd}$ through $N^{th}$ delay elements 520. The $1^{st}$ through $N^{th}$ delay elements 520 may be used in conjunction with a register 510 to implement the delay line provided by the delay lock loop circuit 330. The register 510 may hold various bits (e.g., the register 510 may be a N-bit register, such as a 4-bit register) that may be attached to respective delay elements 520. Various bits in the register may toggle to enable or disable various delay elements 520 to implement a delay on a clock signal.

In one embodiment, the delay elements 520 provide a NAND-to-NAND topology for implementing a delay affected by the shifting of the shift register 510 thereby invoking a delay upon a clock signal. The delay elements 520 may comprise a plurality of gates that may be toggled while providing a topology to substantially reduce the possibility of degradation, thereby providing a reduction in duty cycle distortions. A more detailed illustration and description of the delay elements 520 are provided in FIG. 6 and accompanying description below.

The delay elements 520 may be configured such that NAND-NAND pairs (illustrated in more detail in FIG. 6) in the delay elements 520 experience similar logic states, such that the NAND gates degrade in the same manner. The input to the delay elements 520 may be connected to other delay elements 520 from a preceding delay lock loop circuitry. In other words, the output of one delay element 520 may be connected to the input of a succeeding delay element 520, and so on. Each of the delay elements 520 comprise a plurality of internal logic containing various propagation gates, for example, various NAND gates. However, concepts of the present invention may be implemented for various other gates, such as OR gates, NOR gates, AND gates, and the like, (as illustrated in more detail in FIG. 8 and accompanying description below) and remain within the spirit and scope of the present invention.

Each of the delay elements 520 may also comprise various "entry point" gates, which may connect to various bit points in the register 510. The register 510 may comprise various cells, such as the $1^{st}$ cell 530, the $2^{nd}$ cell 540, through the $N^{th}$ cell 550. Each of these cells may respectively correspond to the $1^{st}$ through $N^{th}$ delay elements 520. Each cell in the register 510 may correspond to a bit that may toggle between logic high and logic low, or may be represented by ones or zeros. For example, a four bit register will comprise four cells carrying different bits that may be shifted until the delay unit 410 (in FIG. 4) adds a predetermined amount of delay to a clock signal. In one embodiment, the delay unit 410 may comprise various sets of registers 510 and delay elements 520 and/or combinations to effect a broad range of delays.

Figure 6:
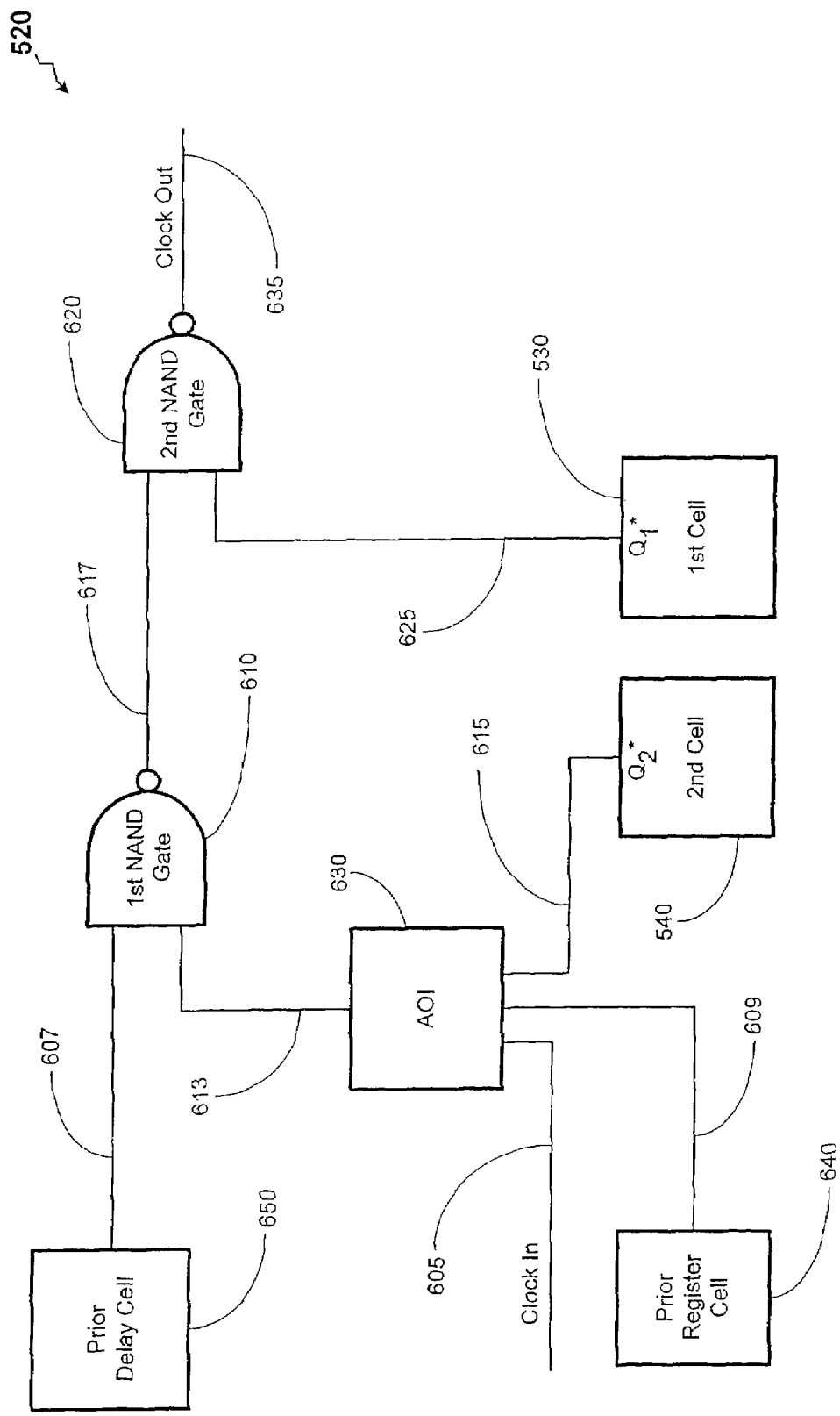
FIG. 6 illustrates a stylized representation of a delay element of FIG. 5, in accordance with one illustrative embodiment of the present invention.

Turning now to FIG. 6, an implementation of the delay element 520 in accordance with one embodiment of the present invention is illustrated. The delay element 520 illustrated in FIG. 6 may comprise various NAND gates. FIG. 6 illustrates a $1^{st}$ NAND gate 610, a $2^{nd}$ NAND gate 620, and an AOI gate 630 (illustrated in more detail in FIG. 8). In one embodiment, the implementation of the AOI gate 630 provides for all of the inputs to the 1$^{st}$ NAND gate 610 and 2$^{nd}$ NAND gate 620 being substantially identical such that they degrade in a similar fashion. As a result of the uniform degradation, duty cycle distortion may be reduced. Propagation time periods may become progressively worse as degradation increases, but utilizing embodiments of the present invention, the propagation delays are substantially uniform such that duty cycle distortion is reduced.

The first NAND gate 610 receives an input on a line 607. In one embodiment, the signal on the line 607 may be a static input. In an alternative embodiment, the signal on the line 607 may be a dynamic signal that may be from other preceding/ prior delay elements/cells 650. The prior delay cell 650 may be an entry point delay line. The prior delay cell 650 may be a representative of an output from another delay element 520 from either the current delay stage or an earlier delay stage that is coupled to this particular delay element 520. A prior register cell 640 may be representative of a register bit from a previous register 510 associated with a preceding delay stage. A second input into the 1$^{st}$ NAND gate 610 is on a line 613, which is an output of the AOI gate 630. The AOI gate 630, in one embodiment, comprises three input signals from a line 605, a line 609, and a line 615. The AOI gate 630 receives a clock IN signal, which is an input clock that is sent into the AOI gate 630 on the line 605. The line 609 carries a second input into the AOI gate 630, which is a signal from the prior register cell 640, which is associated with a preceding delay stage. The third input into the AOI gate 630 is a Q* signal (negative output from a cell of a register 510) on the line 615, which is the Q* output from the 2"d cell 540 in the register 510. These three inputs into the AOI gate 630 result in the NAND output on the line 613, which is the second input into the 1$^{st}$ NAND gate 610.

The output of the 1$^{st}$ NAND gate 610 on a line 617 is provided as an input into the 2"d NAND gate 620. The second input to the 2"d NAND gate 620 on a line 625 is the $Q_1$* signal from the 1$^{st}$ cell 530 of the register 510. The output of the 2$^{nd}$ NAND gate 620 may be a CLOCK OUT signal on a line 635, which is the delayed version of the CLOCK IN signal on a line 605. The delay element 520 provides for a delay upon the CLOCK IN signal on a line 605, to provide a CLOCK OUT signal on a line 635 using a gate configuration such that uniform degradation of the logic gates in the first delay element 520 is provided to reduce duty cycle distortion. The configuration illustrated in FIG. 6 provides that the NAND gates experience substantially the same states of either logic low to logic high, and/or from logic high to logic low, such that the logic gates degrade uniformly.

The AOI gate 630 provides for a one to zero transition that may be directly detected to allow only a single delay stage to act as an entry point to the delay line provided by the delay element 520. Utilizing the circuit provided in FIG. 6, the logic states are all substantially the same such that similar degradations occur.

Figure 7:
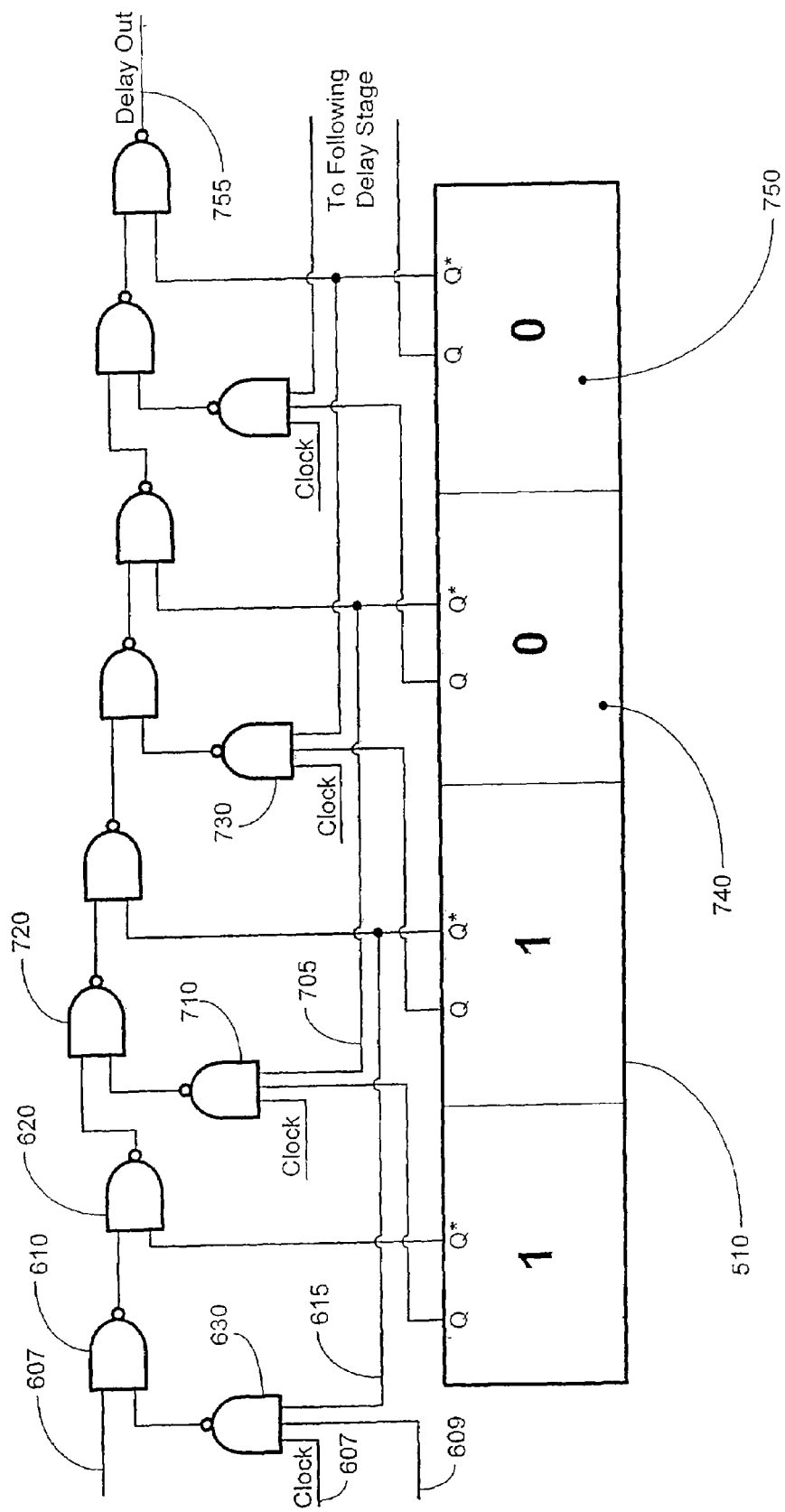
FIG. 7 illustrates a NAND-NAND circuit implementation of a delay element of FIGS. 5 and 6.

Turning now to FIG. 7, implementation of the delay locked loop circuitry in using a NAND gate in place of the AOI gate 630 is illustrated. As described above, the circuitry illustrated in FIG. 7 may comprise a register 510 and various delay elements 520. If the inputs to the 1$^{st}$ NAND gate on the lines 607 and 609 are tied to a static high signal, then the gates 610 and 630 would not toggle. However, the NAND gates 710 and 720 may toggle because they may be preconditioned. This is made possible by the third input on a line 705 into the NAND gate 710, which allows a stage to the left of the entry point, which is the output of a NAND gate 730. This is performed if and/or when the system requires a shift left, i.e., add delay. This allows for the stage to the left of the entry point from the NAND gate 730 to toggle, thereby preconditioning the delay element containing the NAND gates 710 and 720.

When a shift-left command is encountered, the delay element containing the NAND gates 710 and 720 are properly preconditioned. This allows for a 4$^{th}$ cell 750 in the register 510 to determine the correct delay line entry point. It would be desirable that the states of the signals in the logic circuit illustrated in FIG. 7, becomes resolved such that the logic state experienced by the NAND gates that are not used to implement delays are substantially identical. Therefore degradations of the NAND gates in FIG. 7 would become more uniform, thereby reducing duty cycle errors. Therefore, an AOI gate 630 in place of the NAND gates 630, 710, 730 may be implemented, as illustrated in FIG. 8.

As described above, utilizing the NAND-NAND topology for a delay line that may be utilized by the Delay Lock Loop Circuit 330, the unused NAND gates used for potential shifting of delay lines (which are toggling) may see different logic levels or states. This could cause one of the NAND gates to degrade in one manner and the next NAND gate to degrade in a different manner, which may compromise the benefit of utilizing the NAND-NAND delay lines. In other words, the rising time through the delay lines may no longer be the same as the falling time.

Figure 8:
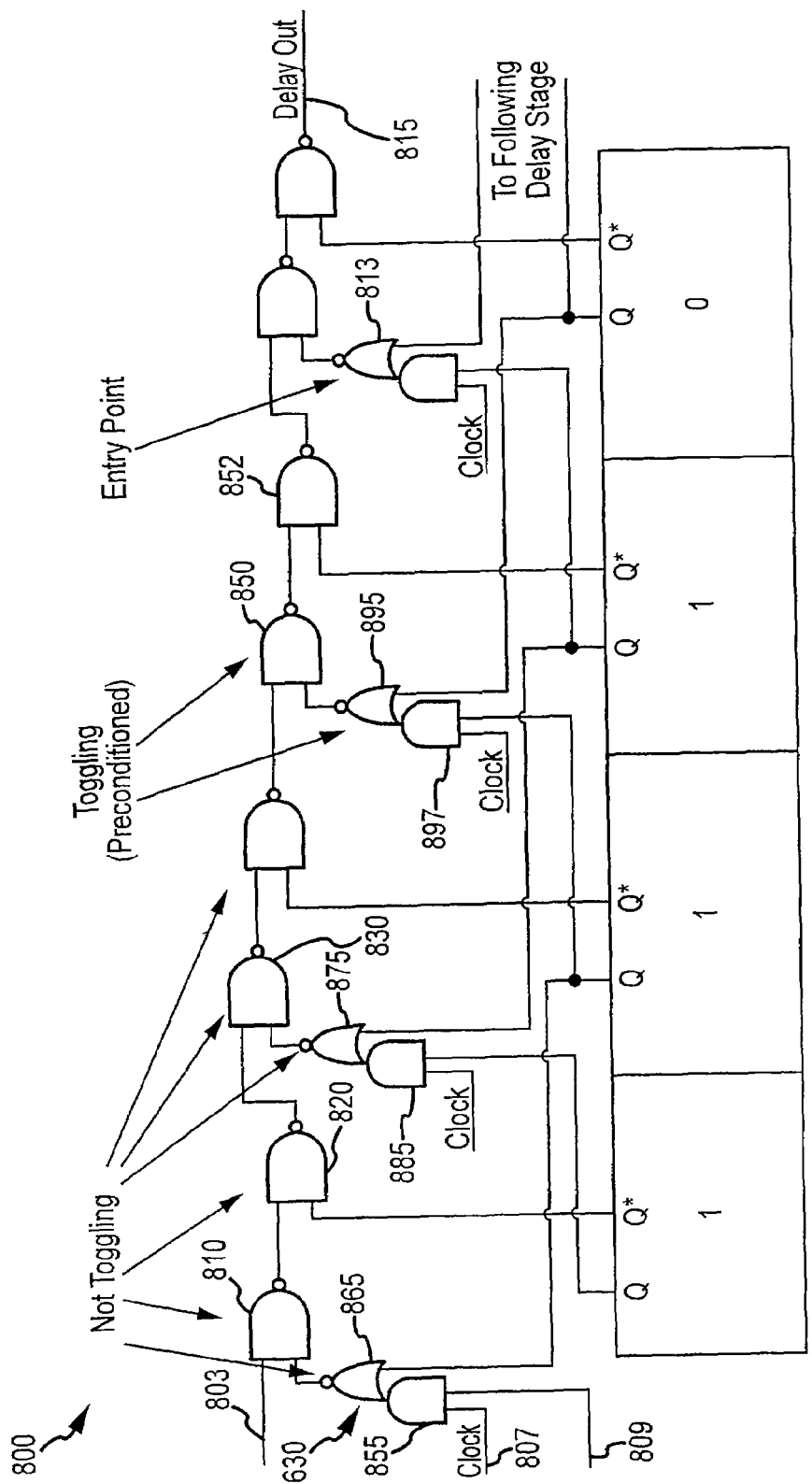
FIG. 8 illustrates a circuit implementation of a delay element of FIGS. 5 and 6, in accordance with one illustrative embodiment of the present invention.

Turning now to FIG. 8, a delay circuit 800 associated with the embodiments of the present invention is illustrated. Utilizing the circuit illustrated in FIG. 8, the NAND gates that are not currently used for implementing the delays (therefore are not toggling), generally experience the same logic levels or states. Regardless of what the logic levels or states are (high or low), one unused NAND gate will see a high and a low on its two terminals wherein the other NAND gate of the NAND-NAND pair experiences the exact same high and low states on corresponding terminals. Therefore, degradation of various components of the NAND gates occur in a uniform manner such that the rising time through the delay line is substantially the same as the falling time throughout the delay line.

FIG. 8 illustrates a NAND gate 810, NAND gate 820, NAND gate 830, and a NAND gate 850 among other NAND gates illustrated in FIG. 8 utilized for the delay line. A line 803 provides a prior delay line provided from a previous delay line associated with a circuitry in which the delay line is utilized. In one embodiment, the entry point of the delay line implementation in the delay circuit illustrated in FIG. 8 occurs at the entry point labeled in FIG. 8 provided by the output from a NOR gate 813. The NAND gates 850, 852 and a NOR gate 895 provide a pre-toggling, preconditioned signal in case a shift-left is required by the delay circuit 800. The gates, AND gate 855 and NOR gate 865, correspond to the AOI gate 630 described in FIG. 6. Continuing to refer to FIG. 8, logic gates prior to the preconditioning set of gates generally do not toggle; see arrows indicating as such in FIG. 8. The AND-NOR pair (AOI) that comprises the AND gate 855 and the NOR gate 865, provides a static signal to the NAND gate 810. Similarly, the AND-NOR pair 885 and 875 provide a similar logic state signal to the NAND gate 830. Also, the AND gate 897 in combination with the NAND gate 850, provide a similar logic state signal to the NOR gate 852. Therefore, the currently unused NAND gates 810, 820, and 830 experience substantially the same static logic level, thereby providing for similar degradation, which would result in reduced duty cycle errors.

The utilization of the circuit 800 provides for similar inputs into the NAND gates 810, 820, and 830 to provide a uniform logic level signal to the inputs of the NAND gates to substantially reduce the possibility of non-uniform degradation of the NAND gates. As described above, the NAND gates 810 and 820 are substantially identical NAND gates and uniform degradation of the various portions of the NAND gates 810 and 820 is desirable to prevent duty cycle distortions. In one embodiment, an input line 803 of the NAND gate 810 is at a static low, therefore the connection from the NAND gate 810 to the input of NAND gate 820 would experience a static high. The output of NAND gate 820 provides a static high to provide a static high input to the NAND gate 830. The fundamental problem that was caused by one of the inputs of one of the unused NAND gates was low, while the corresponding input to another unused NAND gate was static high, resulting in varying degradation of the NAND gates. Therefore, the gate that had the static high would degrade differently than the gate that had the static low. Hence, the drive strength of the NAND gates would change, thereby affecting the propagation delays throughout the delay line provided by the circuit 800. This would cause duty cycle distortion. Other circuit implementation in place of the AOI gate 630 may be implemented and remain within the scope and spirit of the present invention.

Utilizing the circuitry provided for in FIG. 8, the input to the various corresponding inputs of various unused, non-toggling NAND gates 810, 820, and 830, would all experience similar static signals on corresponding inputs. Therefore, the various portions of the NAND gates 810, 820, and 830 would degrade similarly, thereby reducing distortion caused by duty cycle errors. The additional implementation of the AND-NOR combinations 855-865, 885-875, 897-895, provide for similar signal states being fed into correspondingly similar NAND gates 810, 820, 830, 850 and so on. Therefore, the duty cycle errors on the delay out line on a line 815 may be less likely to occur. Hence, the NAND gates in the off-state 810, 820, and 830 provide for power savings as well as consistent degradation of corresponding portions of the NAND gates 810-850, therefore reducing the possibility of duty cycle errors.

Utilizing embodiments of the present invention, a delay lock loop circuitry may be implemented such that degradation in various portions of the logic circuitry occurs more uniformly, thereby reducing the possibility of duty cycle distortion. Therefore, a duty cycle that may be critical in various types of devices, such as various memory devices, in particular, for DDR-DRAMS, may be more consistent. Utilizing embodiments of the present invention, more uniform duty cycles may be provided such that more accurate transition of data will occur. Therefore, throughout the life of a particular device, utilizing embodiments of the present invention, more accurate transition of data may be realized due to the reduction of duty cycle distortion. Therefore, in "burn-in" type processes in manufacturing environments, degradation may be tested by toggling various gates in order to maintain a significantly reduced duty cycle distortion, such that higher yields may be realized as a result of the burn-in test, as well as a reduction of non-uniform degradation.

Utilizing embodiments of the present invention, with the benefit of a reduction in non-uniform degradation of gates in the delay lock loops, implementation of various stages of delay lock loops may be performed without the significant accumulation of duty cycle errors. Therefore, more accurate operation of various devices, such as memory devices, may be realized. The delay lock loop circuit 330 described by embodiments of the present invention may be implemented into a variety of electronic circuits. The teachings of the present invention may be implemented on a plurality of types of memory devices, such as flash memory, DRAM memory, static random access memory (SRAM), double-data rate synchronous DRAM (DDR SDRAM), Rambus™ DRAM (RDRAM), FLASH memory device, and/or other volatile and non-volatile memory devices.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A delay lock loop comprising:
   a plurality of delay elements coupled in series, each comprising at least two logic gates coupled in series and configured to delay an input signal;
   a register coupled to the plurality of delay elements, the register configured to couple a respective control signal to each of the plurality of delay elements to designate the delay element as either a used or an unused delay element; and
   a first control circuit coupled to at least one logic gate of an upstream delay element, and a second control circuit coupled to at least one logic gate of a downstream delay element, the first and second control circuits coupled to the register and configured to receive a same control signal therefrom, the first control circuit configured to receive a clock signal and couple a gate control signal to the at least one logic gate such that corresponding inputs of the at least two logic gates maintain the same static level over a plurality of cycles of the clock signal.

2. The delay lock loop of claim 1 wherein the register comprises a plurality of cells, each cell storing a bit designating a corresponding delay element as used or unused.

3. The delay lock loop of claim 1 wherein the control circuitry comprises a complex logic gate coupled to the register and the at least one of the unused delay elements.

4. The delay lock loop of claim 3 wherein the complex logic gate comprises an AOI gate.

5. The delay lock loop of claim 1 wherein each of the unused delay elements are configured to generate a static output signal and each of the used delay elements are configured to generate an output signal based on signal the clock signal.

6. The delay lock loop of claim 1 wherein the at least two logic gates of the at least one unused delay element comprise two series-coupled NAND gates, the at least one unused delay element configured to receive a static high input signal from an upstream delay element and a static low input signal from the control circuitry, the at least one unused delay element configured to provide a static high output signal to a downstream delay element.

7. The delay lock loop of claim 6 wherein the static high and static low input signals are applied to a first NAND gate of the at least one unused delay element, the first NAND gate generating a static high output signal, the static high output signal coupled to a second NAND gate, the second NAND gate further configured to receive a static low signal from the register and output the static high output signal to the downstream delay element.

8. The delay lock loop of claim 1 wherein the register is further configured to generate at least one of the delay elements as a preconditioning delay element, the output of a first logic gate of the preconditioning delay element configured to toggle in accordance with the clock signal while the output of a second logic gate of the preconditioning delay element is configured to maintain a static level over the plurality of cycles of the clock signal.

9. A method for operating a delay lock loop configured to delay a clock signal, the method comprising:
selecting at least one delay element of a delay line as an unused delay element, the delay element comprising a plurality of series coupled logic gates;
providing a same control signal to a first control circuit coupled to an upstream delay element and to a second control circuit coupled to a downstream delay element; and
maintaining the same static input levels at corresponding inputs of the series coupled logic gates of the unused delay element across a plurality of cycles of the clock signal.

10. The method according to claim 9 further comprising maintaining static output levels at output of the series coupled logic gates of the unused delay element across the plurality of cycles of the clock signal.

11. The method according to claim 9 further comprising changing the unused delay element as a used delay element; and
toggling at least one input of one of the series coupled logic gates of the used delay element corresponding to cycles of the clock signal.

12. The method according to claim 11 wherein the act of changing the unused delay element as the used delay element comprises altering a signal applied to control circuitry coupled to the unused delay element.

13. The method according to claim 9 wherein the act of selecting the at least one delay element comprises setting a bit in a register coupled to the at least one delay element to a bit indicative of an unused delay element.

14. The method according to claim 9 wherein the act of maintaining static input levels at inputs of the series coupled logic gates comprises:
maintaining a static high and a static low input at respective inputs of a first logic gate configured to output a first static high signal responsive to the static high and static low inputs; and
maintaining a static low input to a second logic gate configured to receive the first static high signal from the first logic gate and output a second static high signal.

15. The method according to claim 9 wherein the act of maintaining static delay levels comprises maintaining static delay levels during a first period of time the selected delay element is designated as an unused delay element, the method further comprising designating the unused delay element as a used delay element during a second period of time and coupling an input signal varying in accordance with the clock signal to an input of the selected delay element.

16. The method according to claim 9 further comprising selecting at least one of the delay elements as a preconditioning delay element, an output of a first logic gate of the preconditioning delay element configured to toggle in accordance with the clock signal while the output of a second logic gate of the preconditioning delay element is configured to maintain a static level over the plurality of cycles of the clock signal.

17. A method for generating a delayed clock signal, the method comprising:
coupling an input clock signal to each delay element in a delay line, each of the delay elements including a plurality of serially coupled logic elements;
providing a same control signal to a first control circuit coupled to an upstream logic element and to a second control circuit coupled to a downstream logic element;
designating at least one of the delay elements as an entry delay element, the entry delay element and each downstream delay element of the delay line generating a delayed clock signal based on the input clock signal;
maintaining static same input levels to corresponding inputs of each of the plurality of serially coupled logic elements of at least one of the delay elements upstream of the entry delay element during multiple cycles of the input clock signal.

18. The method according to claim 17 wherein the at least one of the delay elements comprises a first NAND gate serially coupled to a second NAND gate and wherein the act of maintaining static inputs comprises maintaining at least two static inputs to the first NAND gate.

19. The method according to claim 17 wherein the act of designating at least one of the delay elements as an entry delay element comprises setting a bit in a register coupled to the selected delay element.

20. The method according to claim 19 wherein the act of maintaining static inputs comprises setting another bit in the register coupled to the at least one of the delay elements upstream of the entry delay element and generating at least one of the static inputs based on the another bit and the clock signal.

21. The method according to claim 20 wherein the act of maintaining static inputs comprises coupling the clock signal and the another bit to a complex logic gate.

22. The method according to claim 21 wherein the complex logic gate is an AOI gate.

23. The method according to claim 17 further comprising designating at least one of the delay elements upstream of the entry delay element as a preconditioning delay element, an output of a first logic gate of the preconditioning delay element configured to toggle in accordance with the clock signal while the output of a second logic gate of the preconditioning delay element is configured to maintain a static level over the plurality of cycles of the clock signal.

* * * * *